(12) United States Patent
Muro et al.

(10) Patent No.: US 10,319,578 B2
(45) Date of Patent: Jun. 11, 2019

(54) RETARDING POTENTIAL TYPE ENERGY ANALYZER

(71) Applicant: JAPAN SYNCHROTRON RADIATION RESEARCH INSTITUTE, Sayo-gun, Hyogo (JP)

(72) Inventors: Takayuki Muro, Ako-gun (JP); Tomohiro Matsushita, Aioi (JP)

(73) Assignee: JAPAN SYNCHROTRON RADIATION RESEARCH INSTITUTE, Sayo-gun (JP)

( * ) Notice: Subject to any disclaimer, the term of this patent is extended or adjusted under 35 U.S.C. 154(b) by 0 days.

(21) Appl. No.: 15/503,342

(22) PCT Filed: Jan. 21, 2016

(86) PCT No.: PCT/JP2016/051742
§ 371 (c)(1),
(2) Date: Feb. 10, 2017

(87) PCT Pub. No.: WO2017/126089
PCT Pub. Date: Jul. 27, 2017

(65) Prior Publication Data
US 2018/0082829 A1 Mar. 22, 2018

(51) Int. Cl.
*H01J 49/48* (2006.01)
*H01J 37/244* (2006.01)
(Continued)

(52) U.S. Cl.
CPC ............ *H01J 49/488* (2013.01); *H01J 37/05* (2013.01); *H01J 37/244* (2013.01);
(Continued)

(58) Field of Classification Search
CPC ........ H01J 37/244; H01J 49/488; H01J 37/05; H01J 49/022; H01J 2237/24485; H01J 2237/057; H01J 2237/053
See application file for complete search history.

(56) References Cited

U.S. PATENT DOCUMENTS 3,582,649 A * 6/1971 Taylor ................... H01J 37/295
250/305
3,646,344 A * 2/1972 Plows ................... H01J 37/244
250/310
(Continued)

FOREIGN PATENT DOCUMENTS

CH 547530 A 3/1974
DE 1952168 A1 4/1970
(Continued)

OTHER PUBLICATIONS

Jun. 29, 2018 Extended European Search Report issued in European Patent Application No. 16886330.6.
(Continued)

*Primary Examiner* — Wyatt A Stoffa
(74) *Attorney, Agent, or Firm* — Oliff PLC (57) ABSTRACT

A retarding potential type energy analyzer including a front grid electrode, reference grid electrode and rear grid electrode sequentially arranged, with a predetermined amount of potential difference given between the reference grid electrode and the front grid electrode to form an upward potential gradient as well as a potential difference given between the reference grid electrode and the rear grid electrode to form a downward potential gradient, the grid electrodes are arranged so that the distance between the reference grid electrode and the rear grid electrode is shorter than the distance between the reference grid electrode and the front grid electrode, or the potential difference between the reference grid electrode and the rear grid electrode is made to
(Continued)

be greater than the potential difference between the reference grid electrode and the front grid electrode.

13 Claims, 6 Drawing Sheets

(51) Int. Cl.
  *H01J 49/02* (2006.01)
  *H01J 37/05* (2006.01)
(52) U.S. Cl.
  CPC ....... *H01J 49/022* (2013.01); *H01J 2237/053* (2013.01); *H01J 2237/057* (2013.01); *H01J 2237/24485* (2013.01)

(56) References Cited

U.S. PATENT DOCUMENTS

| | | | | |
|---|---|---|---|---|
| 3,760,180 | A * | 9/1973 | Weber | G01N 23/227 250/305 |
| 3,935,454 | A * | 1/1976 | Lee | H01J 49/488 250/305 |
| 4,179,604 | A * | 12/1979 | Christou | G01T 1/20 250/305 |
| 4,246,479 | A * | 1/1981 | Gopinathan | H01J 37/05 250/305 |
| 4,255,661 | A * | 3/1981 | Liebl | H01J 37/285 250/305 |
| 4,355,232 | A * | 10/1982 | Todokoro | G01R 31/305 250/310 |
| 4,464,571 | A * | 8/1984 | Plies | H01J 37/05 250/305 |
| 4,514,682 | A * | 4/1985 | Feuerbaum | H01J 49/44 324/409 |
| 4,546,254 | A | 10/1985 | Yamauchi | |
| 4,769,543 | A * | 9/1988 | Plies | G01R 31/305 250/305 |
| 5,408,098 | A * | 4/1995 | Wells | H01J 37/244 250/305 |
| 5,654,543 | A * | 8/1997 | Li | H01J 49/401 250/282 |
| 8,203,119 | B2 * | 6/2012 | Degenhardt | H01J 37/244 250/296 |
| 2012/0155509 | A1 * | 6/2012 | Ishii | G01K 11/30 374/159 |

FOREIGN PATENT DOCUMENTS

| | | |
|---|---|---|
| DE | 2151167 A1 | 5/1973 |
| DE | 2842527 A1 | 4/1980 |
| FR | 1534951 A | 8/1968 |
| FR | 2021163 A1 | 7/1970 |
| FR | 2157476 A5 | 6/1973 |
| FR | 2437695 A1 | 4/1980 |
| GB | 1 277 466 A | 6/1972 |
| GB | 1389119 A | 4/1975 |
| GB | 2030761 A | 4/1980 |
| IT | 1120456 B | 3/1986 |
| JP | S55-046491 A | 4/1980 |
| JP | S57-072072 A | 5/1982 |
| JP | H06-044931 A | 2/1994 |
| JP | 5545577 B2 | 7/2014 |
| WO | 2011/014677 A1 | 2/2011 |

OTHER PUBLICATIONS

Aydil, E.S. et al. "Incidence angle distributions of ions bombarding grounded surfaces in high density plasma reactors". pp. 75-82. 1998.
Price, G.L. et al. "Angle-Resolved UPS Measurements in a Modified LEED System". pp. 507-515. 1977.
Wahlstrom, P. et al. "Calibration of charge state conversion surfaces for nuetral particle detectors". Journal of Applied Physics 104. 2008.
Gay, Timothy. "Mott electron polarimetry". Rev. Sci. Instrum., vol. 63, No. 2. pp. 1635-1651. 1992.
Apr. 19, 2016 Written Opinion issued in International Patent Application No. PCT/JP2016/051742.
Apr. 19, 2016 International Search Report issued in International Patent Application No. PCT/JP2016/051742.

* cited by examiner

| | Electrode type | r1 | r2 | r3 | dV(Front) | dV(Rear) | Potential-gradient ratio (Rear/Front) |
|---|---|---|---|---|---|---|---|
| Present example M1 | Mesh electrode 1 | 12.00 | 40.00 | 42.00 | 1.07E-02 | -5.25E-01 | 49.0 |
| Comparative example M1 | Mesh electrode 1 | 38.00 | 40.00 | 42.00 | 4.75E-01 | -5.25E-01 | 1.1 |
| Present example M2 | Mesh electrode 2 | 12.00 | 40.00 | 42.00 | 1.07E-02 | -5.25E-01 | 49.0 |
| Comparative example M2 | Mesh electrode 2 | 38.00 | 40.00 | 42.00 | 4.75E-01 | -5.25E-01 | 1.1 |
| Present example P1-1 | Plate electrode 1 | 12.00 | 40.00 | 42.00 | 1.07E-02 | -5.25E-01 | 49.0 |
| Present example P1-2 | Plate electrode 1 | 32.00 | 40.00 | 42.00 | 1.00E-01 | -5.25E-01 | 5.3 |
| Comparative example P1 | Plate electrode 1 | 38.00 | 40.00 | 42.00 | 4.75E-01 | -5.25E-01 | 1.1 |

Fig. 4A
PRESENT EXAMPLE M1 (MESH 1, RATIO 49)

Fig. 4B
COMPARATIVE EXAMPLE M1 (MESH 1, RATIO 1)

Fig. 4C
PRESENT EXAMPLE M2 (MESH 2, RATIO 49)

Fig. 4D
COMPARATIVE EXAMPLE M2 (MESH 2, RATIO 1)

Fig. 5A
PRESENT EXAMPLE P1-1 (PLATE 1, RATIO 49)

Fig. 5B
PRESENT EXAMPLE P1-2 (PLATE 1, RATIO 5)

Fig. 5C
COMPARATIVE EXAMPLE P1 (PLATE 1, RATIO 1)

Fig. 6

| | Electrode type | r1 | r2 | r3 | dV(Front) | dV(Rear) | Potential-gradient ratio (Rear/Front) |
|---|---|---|---|---|---|---|---|
| Present example P1-1 | Plate electrode 1 | 12.00 | 40.00 | 42.00 | 1.07E-02 | -5.25E-01 | 49.0 |
| Present example P1-3 | Plate electrode 1 | 12.00 | 38.32 | 42.00 | 1.19E-02 | 2.98E-01 | 25.0 |
| Present example P1-4 | Plate electrode 1 | 12.00 | 34.22 | 42.00 | 1.58E-02 | 1.58E-01 | 10.0 |
| Present example P1-5 | Plate electrode 1 | 12.00 | 29.70 | 42.00 | 2.28E-02 | 1.15E-01 | 5.0 |
| Present example P2-1 | Plate electrode 2 | 12.00 | 34.22 | 42.00 | 1.58E-02 | 1.58E-01 | 10.0 |
| Present example P2-2 | Plate electrode 2 | 12.00 | 29.70 | 42.00 | 2.28E-02 | 1.15E-01 | 5.0 |

Fig. 7A
PRESENT EXAMPLE P1-1
(PLATE 1, RATIO 49)

Fig. 7B
PRESENT EXAMPLE P1-3
(PLATE 1, RATIO 25)

Fig. 7C
PRESENT EXAMPLE P1-4
(PLATE 1, RATIO 10)

Fig. 7D
PRESENT EXAMPLE P1-5
(PLATE 1, RATIO 5)

Fig. 7E
PRESENT EXAMPLE P2-1
(PLATE 2, RATIO 10)

Fig. 7F
PRESENT EXAMPLE P2-2
(PLATE 2, RATIO 5)

RETARDING POTENTIAL TYPE ENERGY ANALYZER

TECHNICAL FIELD

The present invention relates to a retarding potential type energy analyzer used for analyzing charged particles, such as electrons or ions.

BACKGROUND ART

A retarding potential type energy analyzer is a detector which selectively detects charged particles (e.g. electrons or ions) having amounts of energy equal to or higher than a specific level from the charged particles emitted from a charged-particle source (such as a sample being analyzed or charged-particle radiation source). A retarding potential type energy analyzer normally includes: three plate-shaped grid electrodes (front grid electrode, intermediate grid electrode and rear grid electrode) arranged at regular intervals in the travelling direction of the charged particles; a voltage applier for applying voltages to those grid electrodes; and a detector. As the grid electrodes, a plate-shaped electrode having a large number of through-holes bored in its thickness direction has been used (for example, Patent Literature 1). A mesh-like electrode consisting of woven wire has also been used.

In the retarding potential type energy analyzer, for example, the front and rear grid electrodes are grounded, while the intermediate grid electrode is supplied with a predetermined amount of voltage having the same polarity as the charged particles as the measurement target. As a result, a potential difference which blocks the entry of the charged particles is formed between the front and intermediate grid electrodes, while a potential difference which accelerates the charged particles toward the detector is formed between the intermediate and rear grid electrodes. The charged particles emitted from the sample are decelerated during their travel from the front grid electrode toward the intermediate grid electrode. Only the particles which have arrived at and passed through the intermediate grid electrode are guided to the detector.

CITATION LIST

Patent Literature

Patent Literature 1: JP H6-44931 A

SUMMARY OF INVENTION

Technical Problem

In principle, with a retarding potential type energy analyzer, it should be possible to obtain an energy spectrum of charged particles by using the difference in the detection intensity of the charged particles at a plurality of retarding-voltage differences specified at certain intervals of value. However, conventional retarding potential type energy analyzers have low levels of energy-resolving power and cannot be used to obtain an energy spectrum in a photoelectron spectroscopy or similar spectroscopic measurement.

The problem to be solved by the present invention is to provide a retarding potential type energy analyzer capable of performing a measurement on charged particles with a higher level of energy-resolving power than the conventional device.

Solution to Problem

The present inventors have searched for the reason why a high level of energy-resolving power cannot be achieved in the conventional retarding potential type energy analyzer (having the configuration of three grid electrodes in the form of planer or spherical plates arranged at regular intervals, with the intermediate grid electrode maintained at a retarding voltage). As a result, the following fact has been identified.

Ideally, in the retarding potential type energy analyzer, equipotential surfaces parallel to the surfaces of the front and intermediate grid electrodes should be formed in the space between these two electrodes so that the charged particles perpendicularly travel into those equipotential surfaces. Actually, due to the presence of the large number of through-holes in the grid electrodes, such equipotential surfaces cannot be formed in the vicinity of the entrance of the through-hole; a potential gradient whose potential level decreases from the circumference to the center of the through-hole appears in a surface parallel to the surface of the grid electrode. In the vicinity of the intermediate grid electrode maintained at the retarding voltage, since charged particles have already been decelerated by the potential difference between the front and intermediate grid electrodes, the travelling direction of a charged particle incident on a through-hole of the intermediate grid electrode is considerably affected by the potential gradient at the entrance of this through-hole as well as within the same through-hole. Consequently, some of the charged particles collide with the inner wall of the through-holes of the grid electrode and become lost, so that the energy-resolving power becomes low.

The present invention has been developed taking into account the previously described factor. Specifically, it is based on the finding obtained through the simulations carried out by the present inventors for various arrangements of the grid electrodes and amounts of the applied voltages, which revealed that the electric field in the vicinity of the entrances of the through-holes of the intermediate electrode can be adjusted so that the charged particles can easily pass through the through-holes, by increasing the downward potential gradient formed on the detector-side of the intermediate grid electrode maintained at the retarding potential (to be exact, by increasing the ratio of this downward potential gradient to the upward potential gradient formed on the side facing the charged-particle source) as compared to the conventional device.

The first mode of the present invention developed for solving the previously described problem is a retarding potential type energy analyzer for measuring the energy of a charged particle emitted from a charged-particle source, using a charged-particle detector, the analyzer including:

a) three grid electrodes sequentially arranged as a front grid electrode, a reference grid electrode and a rear grid electrode in the mentioned order between the charged-particle source and the charged-particle detector, in such a manner that the distance between the reference grid electrode and the rear grid electrode is shorter than the distance between the reference grid electrode and the front grid electrode; and b) a voltage applier for applying voltage to at least one of the three grid electrodes so as to give an upward potential difference with a predetermined magnitude between the reference grid electrode and the front grid electrode as well as a downward potential difference with a magnitude equal to or greater than the upward potential difference between the reference grid electrode and the rear grid electrode.

The second mode of the present invention developed for solving the previously described problem is a retarding potential type energy analyzer for measuring the energy of a charged particle emitted from a charged-particle source, using a charged-particle detector, the analyzer including:

a) three grid electrodes sequentially arranged as a front grid electrode, a reference grid electrode and a rear grid electrode in the mentioned order between the charged-particle source and the charged-particle detector, in such a manner that the distance between the reference grid electrode and the front grid electrode is equal to or longer than the distance between the reference grid electrode and the rear grid electrode; and b) a voltage applier for applying a voltage to at least one of the three grid electrodes so as to give an upward potential difference with a predetermined magnitude between the reference grid electrode and the front grid electrode as well as a downward potential difference with a magnitude greater than the upward potential difference between the reference grid electrode and the rear grid electrode.

For example, the grid electrodes are plate electrodes having through-holes bored in their thickness direction, or mesh electrodes consisting of woven wire. Various shapes of electrodes can be used as the grid electrodes, such as planer grid electrodes, spherical grid electrodes or curved grid electrodes.

The upward potential difference is a potential difference having the same polarity as the charged particle for forming a gradient which decelerates this particle. The downward potential difference is a potential difference having the opposite polarity to the charged particle for forming a gradient which accelerates this particle.

In the case of using a detector that can maintain the charged-particle receiving surface at a specific potential, such as a microchannel plate (MCP) or similar charged-particle detector, the receiving surface of the detector can be used as the rear grid electrode.

As noted earlier, in the conventional retarding potential type energy analyzer, three grid electrodes are arranged at regular intervals, and the retarding voltage is formed at the reference grid electrode to measure the energy of the charged particle. If the grid electrodes are planer grid electrodes, the ratio of the downward potential gradient to the upward potential gradient is 1.0. If the grid electrodes are spherical grid electrodes, the ratio depends on the spacing (regular intervals) of the grids; for example, when the front, reference and rear grid electrodes are respectively located at distances of 38 mm, 40 mm and 42 mm from the charged-particle source (i.e. the spacing of the grid electrodes is 2 mm), the potential-gradient ratio is approximately 1.1. That is to say, whichever the planer grid electrodes or spherical grid electrodes are used, the ratio between the two potential gradients formed by the conventional electrode arrangement is approximately 1.

In the first mode of the retarding potential type energy analyzer according to the present invention, the three grid electrodes are arranged so that the distance between the reference grid electrode and the rear grid electrode is shorter than the distance between the reference grid electrode and the front grid electrode, to obtain a greater potential-gradient ratio than in the conventional device. In the second mode, this is achieved by making the potential difference between the reference grid electrode and the rear grid electrode greater than the potential difference between the reference grid electrode and the front grid electrode.

In the retarding potential type energy analyzer according to the present invention, the potential gradient on the rear side (to be exact, the ratio of the potential gradient on the rear side to the potential gradient on the front side) is greater than in the conventional device. As a result, in the case of the plate electrodes, the curvature of the equipotential surfaces in the vicinity of the entrance of the through-hole of the reference grid electrode is decreased so as to prevent the trajectory of the charged particles from being curved in the vicinity of the entrance of the through-hole and causing the charged particles to collide with the inner wall of the through-hole, while the curvature of the equipotential surfaces in the vicinity of the exit of the through-hole is increased so as to converge the charged particles toward the center of the exit. In the case of the mesh electrodes, increasing the potential-gradient ratio produces a lens effect for converging the charged particles into the openings of the mesh, so that a charged particle which would collide with the wire of the mesh electrode and be lost in the conventional arrangement can pass through the openings of the mesh. The lens effect is a conventionally known effect which converges charged particles into the openings of the mesh (the spaces where charged particles pass through). In summary, by using the retarding potential type energy analyzer according to the present invention, the loss of the charged particles is reduced, so that a high level of energy-resolving power and high level of detection sensitivity can be achieved.

The retarding potential type energy analyzer according to the present invention can be embodied in various forms. For example, it can be embodied by arranging the three grid electrodes (front, reference and rear grid electrodes) at regular intervals, connecting the front grid electrode to a ground, and applying a voltage having the same polarity as the charged particle (retarding voltage) to the reference grid electrode as well as a voltage having the opposite polarity to the charged particle to the rear grid electrode. In this case, in order for the charged particle that has passed through the rear grid electrode to be assuredly transported to the charged-particle detector without being decelerated, the same voltage as applied to the rear grid electrode should preferably be applied to the receiving surface of the charged-particle detector, and more preferably, the amount of this voltage should be equal to that of the voltage applied to the rear grid electrode. As another example, the analyzer can be embodied by applying a voltage having the same polarity as the charged particle (retarding voltage) to only the reference grid electrode while connecting both the front and rear grid electrodes to a ground, and making the distance between the front grid electrode and the reference grid electrode longer than the distance between the rear grid electrode and the reference grid electrode.

In the case of using spherical grid electrodes as the grid electrodes, if a two-dimensional detector is used as the charged-particle detector, it is possible to measure the angular distribution of the charged particles emitted from one point on a sample, along with the energy of those particles, with a higher level of angle-resolving power than achieved by a conventional technique.

Advantageous Effects of the Invention

With the retarding potential type energy analyzer according to the present invention, a measurement of charged particles can be performed with a higher level of energy-resolving power than the conventional level.

DESCRIPTION OF EMBODIMENTS

One embodiment of the retarding potential type energy analyzer according to the present invention as well as a method for measuring the energy of charged particles using the same analyzer is hereinafter described with reference to the drawings. In the retarding potential type energy analyzer of the present embodiment, photoelectrons with higher amounts of energy than a predetermined threshold are selectively detected among the charged particles emitted from a charged-particle source (e.g. a sample or particle-radiation source).

Figure 1:
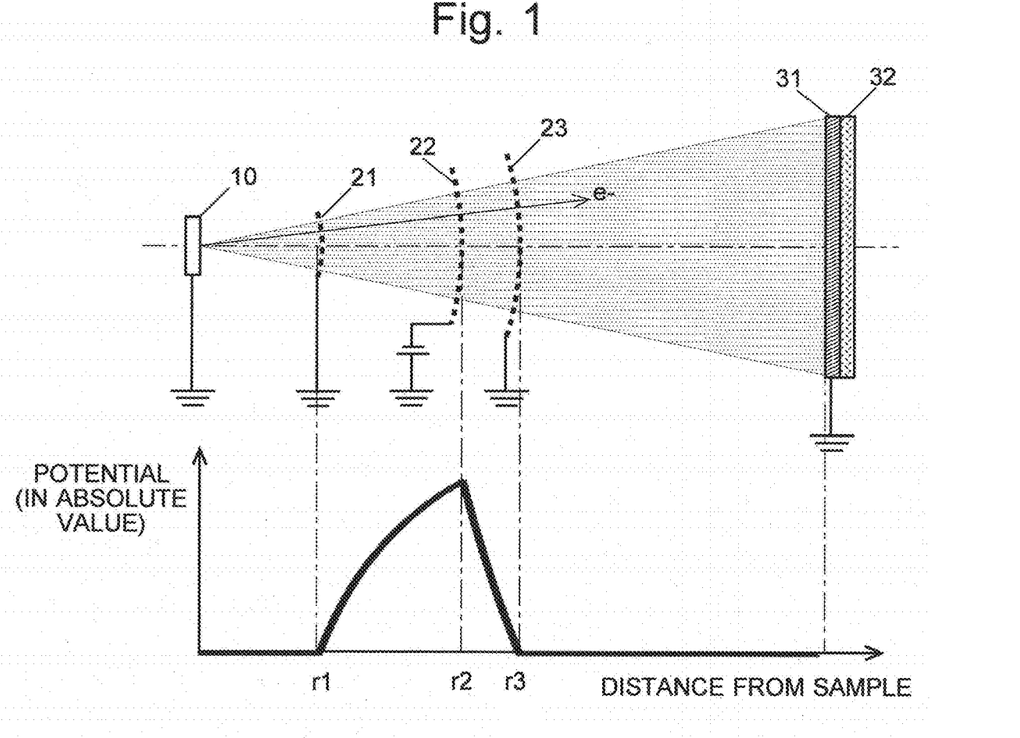
FIG. 1 is a configuration diagram of the main components in one embodiment of the retarding potential type energy analyzer according to the present invention.

FIG. 1 shows the configuration of the main components of the retarding potential type energy analyzer of the present embodiment. The retarding potential type energy analyzer of the present embodiment includes a front grid electrode 21 located at distance r1 from a sample 10, an intermediate grid electrode 22 located at distance r2, and a rear grid electrode 23 located at distance r3, as well as a two-dimensional detector having a microchannel plate (MCP) 31, fluorescent screen 32 and imaging device (not shown) for photographing a fluorescent image on the fluorescent screen 32. The front grid electrode 21, intermediate grid electrode 22 and rear grid electrode 23 are all spherical grid electrodes.

Each grid electrode is either a plate electrode having a large number of through-holes periodically formed at predetermined intervals, or mesh electrode consisting of woven wire. The sample 10 is placed on a sample stage (not shown) connected to a ground. A beam of X-rays having a predetermined amount of energy is cast from a light source (not shown) onto one point on the surface of the sample. For the grid electrodes, various non-magnetic metallic materials (e.g. aluminum, gold, platinum, copper, titanium, tantalum, tungsten, molybdenum, or stainless steel) can be used. In the case where the grid electrodes are plate electrodes, it is preferable to use copper or titanium, taking into account the workability in the process of forming the through-holes or other factors. In the case where the grid electrodes are mesh electrodes, it is preferable to use tungsten, molybdenum or stainless steel, taking into account the workability in the wire-weaving process. An appropriate kind of plate processing for preventing the surface oxidation should preferably be performed taking into account the use conditions and material properties.

The front grid electrode 21, rear grid electrode 23 and charged-particle receiving surface of the MCP 31 are grounded, while the intermediate grid electrode 22 is supplied with a predetermined amount of voltage having the same polarity (negative) as the charged particles to be analyzed (photoelectrons), whereby the retarding voltage is formed. In the present description, the grid electrode at which the retarding voltage is formed is also called the "reference grid electrode". In the present embodiment, a negative retarding voltage is formed since the measurement target is negatively-charged particles (photoelectrons). If the measurement target is positively-charged particles (e.g. positive ions), a positive retarding voltage should be formed.

In the retarding potential type energy analyzer of the present embodiment, the rear grid electrode 23 is positioned so that the distance from the intermediate grid electrode 22 to the rear grid electrode 23 (r3−r2) is shorter than the distance from the front grid electrode 21 to the intermediate grid electrode 22 (r2−r1). As a result, as shown in the lower part of FIG. 1, the ratio of the downward potential gradient formed from the intermediate grid electrode 22 to the rear grid electrode 23 (which is hereinafter called the "rear-side potential gradient") to the upward potential gradient formed from the front grid electrode 21 to the intermediate grid electrode 22 (which is hereinafter called the "front-side potential gradient") is larger than the conventional ratio. The "upward" potential gradient means the gradient of a potential difference which has the same polarity as the charged particles and decelerates those particles, while the "downward" potential gradient means the gradient of a potential difference which has the opposite polarity to the charged particles and accelerates those particles.

Figure 2A:
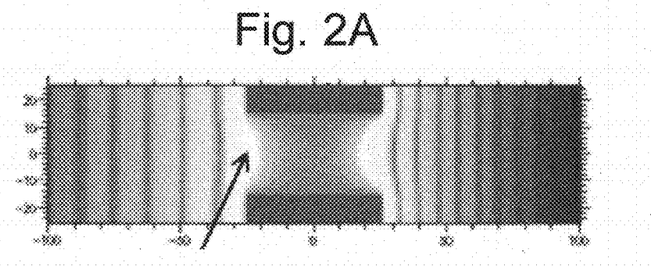
FIGS. 2A and 2B are graphics illustrating the surface potential near the intermediate grid electrode.

The reason for creating the potential gradients in the previously described form in the retarding potential type energy analyzer of the present embodiment is hereinafter described:

Retarding potential type energy analyzers are configured on the assumption that concentric equipotential surfaces centering on the sample position (to be exact, the point of X-ray irradiation on the sample surface) are formed between the front and intermediate grid electrodes so that the charged particles perpendicularly travel into those equipotential surfaces. Actually, as indicated by the arrow in FIG. 2A, a potential gradient whose potential level decreases from the circumference to the center of the through-hole is present in a surface parallel to the surface of the intermediate grid electrode. In the vicinity of the intermediate grid electrode maintained at the retarding voltage, since charged particles have already been decelerated by the potential difference between the front and intermediate grid electrodes, the travelling direction of the charged particles incident on the through-hole of the intermediate grid electrode is considerably affected by the aforementioned potential gradient. Consequently, some of the charged particles collide with the inner wall of the through-hole formed in the plate electrode and become lost, so that the energy-resolving power becomes low.

Figure 2B:
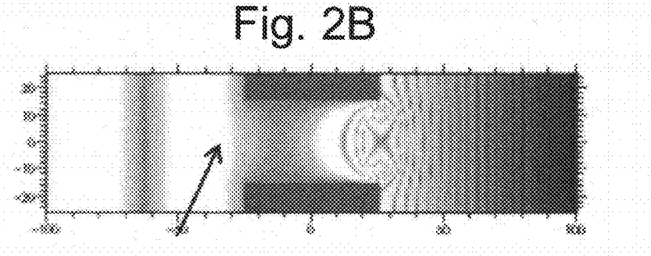

The present inventors have studied various configurations and discovered the following fact: By increasing the ratio of the rear-side potential gradient to the front-side potential gradient from the conventional value as shown in FIG. 1, the curvature of the equipotential surfaces in the vicinity of the entrance of the through-hole of the intermediate grid electrode 22 can be decreased, as indicated by the arrow in FIG. 2B, so as to prevent the trajectory of the charged particle from being curved in the vicinity of the entrance of the through-hole and causing the charged particle to collide with the inner wall of the through-hole, while the curvature of the equipotential surfaces in the vicinity of the exit of the through-hole is increased so as to converge the charged particle toward the center of the exit (in the case of the plate electrode). In the case of the mesh electrode, it was found that increasing the potential-gradient ratio produces a lens effect for converging the charged particle into the openings of the mesh, whereby low-speed charged particles can be prevented from colliding with the electrode. The configuration of the previously described embodiment is based on these findings.

In order to verify the effect obtained by adopting the configuration of the previously described embodiment, the transmittance of the electron was simulated for various arrangements of the three spherical grid electrodes with the potential-gradient ratio (rear-side potential gradient/front-side potential gradient) varied by changing the position r1 of the front grid electrode 21 in relation to the sample 10 while maintaining the distance r2 of the intermediate grid electrode 22 at 40 mm and the distance r3 of the rear grid electrode 23 at 42 mm.

Figure 3:
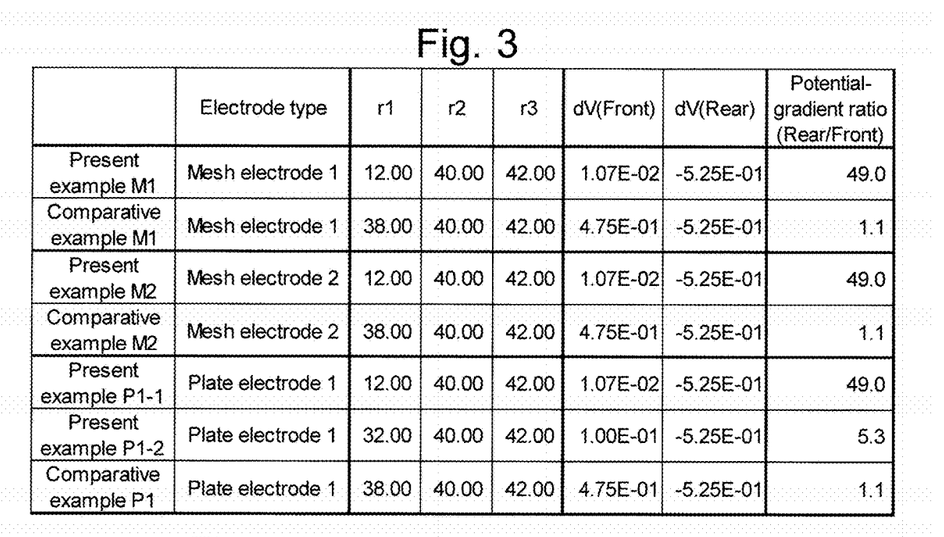
FIG. 3 is a table showing a configuration used in a simulation of the electron transmittance.

FIG. 3 shows a list of the spherical grid electrodes used in the simulation. Two mesh electrodes ("mesh electrodes 1 and 2") and one plate electrode ("plate electrode 1") were used as the spherical grid electrodes. The mesh electrode 1 had 508 openings (mesh openings) per one inch (2.54 cm), with 81% of its surface area occupied by the openings (opening interval, 50 μm; wire diameter, 5 μm). The mesh electrode 2 had 254 openings (mesh openings) per one inch (2.54 cm), with 81% of its surface area occupied by the openings (opening interval, 100 μm; wire diameter, 10 μm). The plate electrode 1 was a dome-shaped metallic body having a thickness of 100 μm, with openings (through-holes) having a diameter of 60 μm formed at intervals of 100 μm.

Figure 4A:
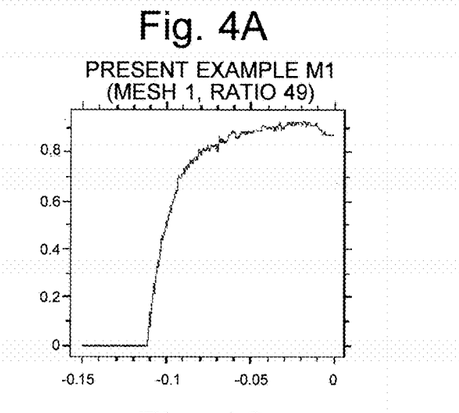
FIGS. 4A-4D are the results of the simulation of the electron transmittance in the case of using mesh electrodes.
Figure 4B:
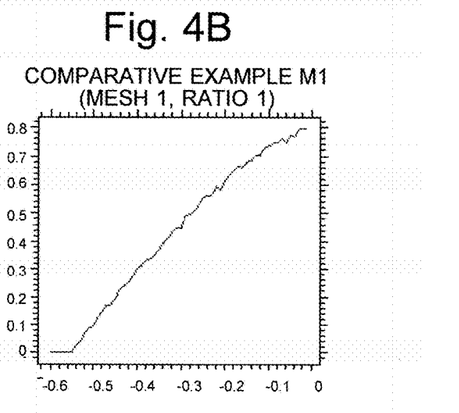
Figure 4C:
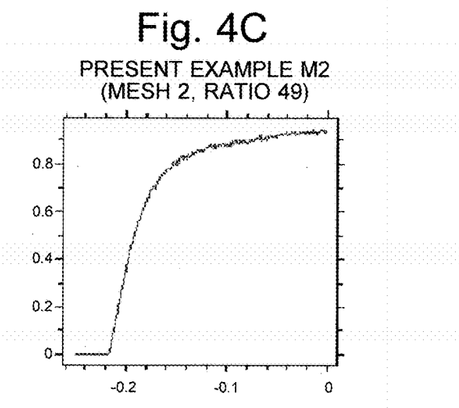
Figure 4D:
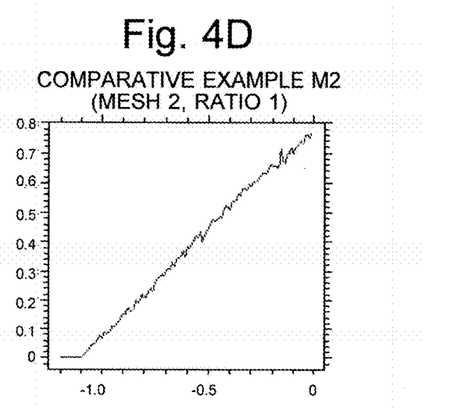

FIGS. 4A-4D show the simulation results related to the present example M1 and comparative example M1 in which the mesh electrode 1 was used, as well as the simulation results related to the present example M2 and comparative example M2 in which the mesh electrode 2 was used. Specifically, the present examples M1 and M2 shown in FIGS. 4A and 4C are the simulation results obtained in the case where the distance r1 from the sample 10 to the front grid electrode 21 was set at 12 mm, the distance from the front grid electrode 21 to the intermediate grid electrode 22 (r2−r1) was set at 28 mm, and the distance from the intermediate grid electrode 22 to the rear grid electrode 23 (r3−r2) was set at 2 mm (the potential-gradient ratio was 49.0), while the comparative examples M1 and M2 shown in FIGS. 4B and 4D are the simulation results obtained in the case where the distance from the front grid electrode 21 to the intermediate grid electrode 22 (r2−r1) and the distance from the intermediate grid electrode 22 to the rear grid electrode 23 (r3−r2) were both set at 2 mm (the potential-gradient ratio was 1.1). In these figures, the horizontal axis represents the difference between a potential-difference value obtained by dividing the kinetic energy of the photoelectron by the elementary charge and the value of the retarding voltage (the potential difference between the front grid electrode 21 and the intermediate grid electrode 22), expressed as the ratio (percentage) to the value of the retarding voltage. The vertical axis represents the transmittance of the electron.

Comparing the present example M1 and comparative example M1 (both of which used the mesh electrode 1), or present example M2 and comparative example M2 (both of which used the mesh electrode 2), demonstrates that the graphs of the present examples M1 and M2 show a steeper rise than those of the comparative examples M1 and M2. This means that the energy-resolving power has been improved from the comparative examples M1 and M2 which used the conventional configuration. A comparison of the present example M1 (mesh electrode 1) and present example M2 (mesh electrode 2) shows that using a finer mesh electrode (i.e. a mesh electrode which is more finely woven) provides a higher level of energy-resolving power.

Figure 5A:
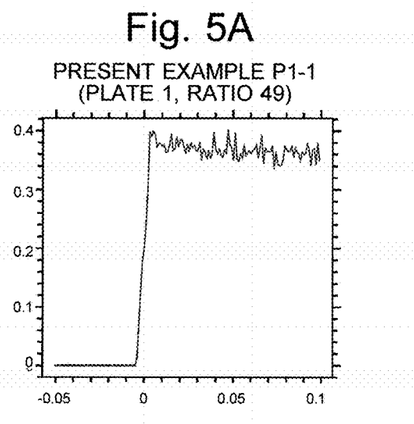
FIGS. 5A-5C are the results of the simulation of the electron transmittance in the case of using plate electrodes.
Figure 5B:
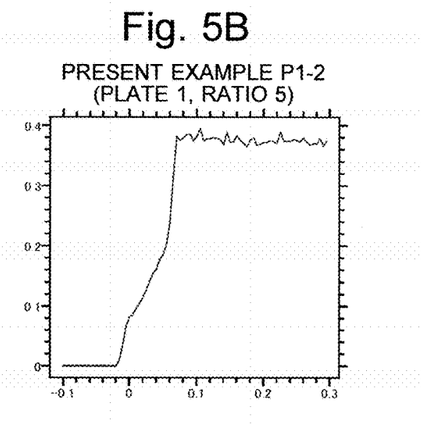
Figure 5C:
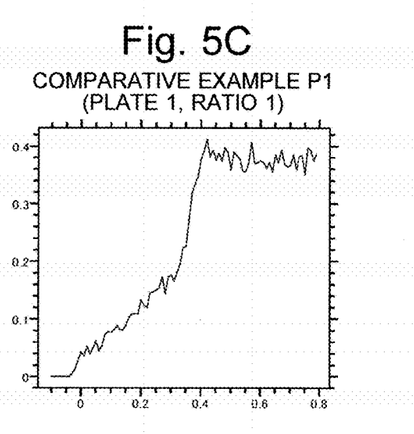

FIGS. 5A-5C are the simulation results related to the present examples P1-1 and P1-2 as well as comparative example P1 all of which used the plate electrode 1. Specifically, the present example P1-1 shown in FIG. 5A is the simulation result obtained in the case where the distance r1 from the sample 10 to the front grid electrode 21 was set at 12 mm, the distance from the front grid electrode 21 to the intermediate grid electrode 22 (r2−r1) was set at 28 mm, and the distance from the intermediate grid electrode 22 to the rear grid electrode 23 (r3−r2) was set at 2 mm (the potential-gradient ratio was 49.0). The present example P1-2 shown in FIG. 5B is the simulation result obtained in the case where the distance r1 from the sample 10 to the front grid electrode 21 was set at 32 mm, the distance from the front grid electrode 21 to the intermediate grid electrode 22 (r2−r1) was set at 8 mm, and the distance from the intermediate grid electrode 22 to the rear grid electrode 23 (r3−r2) was set at 2 mm (the potential-gradient ratio was 5.3). The comparative example P1 shown in FIG. 5C is the simulation result obtained in the case where the distance from the front grid electrode 21 to the intermediate grid electrode 22 (r2−r1) and the distance from the intermediate grid electrode 22 to the rear grid electrode 23 (r3−r2) were both set at 2 mm (the potential-gradient ratio was 1.1).

Similarly to the case of the mesh electrode, comparing the present examples P1-1 and P1-2 with the comparative example P1 (all of which used the plate electrode 1) demonstrates that the graphs of the present examples P1-1 and P1-2 show a steeper rise than that of the comparative example P1, which means an improved energy-resolving power. Furthermore, as compared to the present example P1-2, the graph of the present example P1-1 (having a greater value of the potential-gradient ratio) shows a steeper rise and therefore provides a higher level of energy-resolving power.

Additionally, although depending on the shape and arrangement of the electrodes, comparing FIGS. 4A-4D with FIGS. 5A-5C indicates, as a general tendency, that mesh electrodes have the advantage of increasing the transmittance of the electron and improving the sensitivity, while plate electrodes have the advantage of improving the energy-resolving power.

As another simulation, the transmittance of the electron was simulated for various arrangements of the three spherical grid electrodes, with the potential-gradient ratio (rear-side potential gradient/front-side potential gradient) varied by changing the distance r2 of the intermediate grid electrode 22 from the sample 10 while maintaining the distance r1 of the front grid electrode 21 from the sample 10 at 12 mm and the distance r3 of the rear grid electrode 23 at 42 mm.

This simulation was only performed for spherical grid electrodes in the form of a plate.

Figure 6:
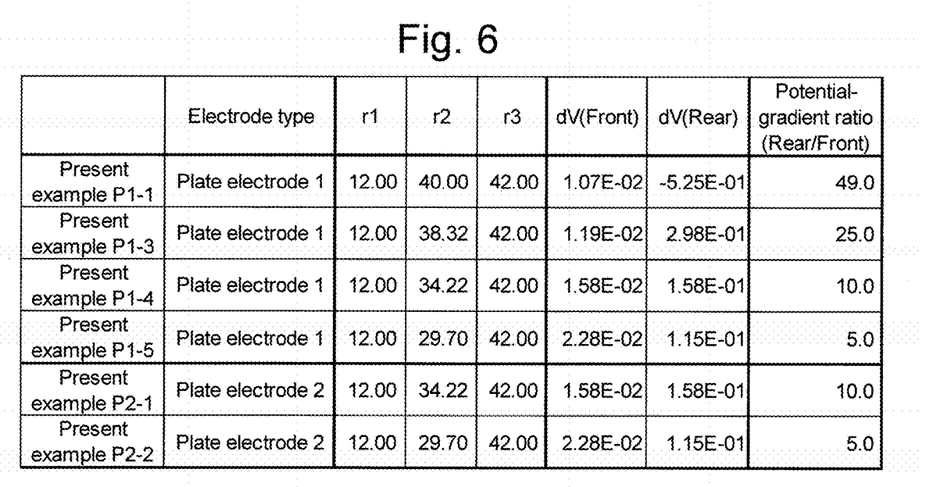
FIG. 6 is a table showing a second configuration used in the simulation of the electron transmittance.
Figure 7A:
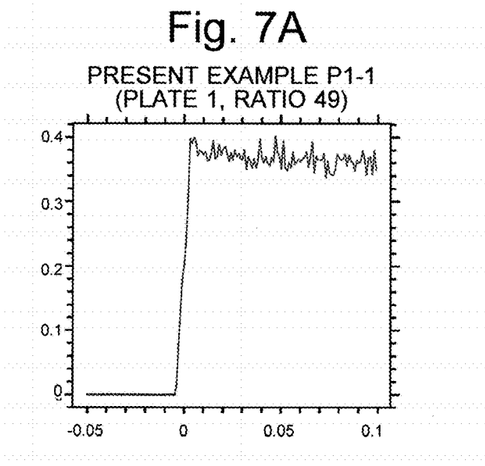
FIGS. 7A-7F are the results of the simulation of the electron transmittance in the case of using the plate electrodes in the second configuration.
Figure 7B:
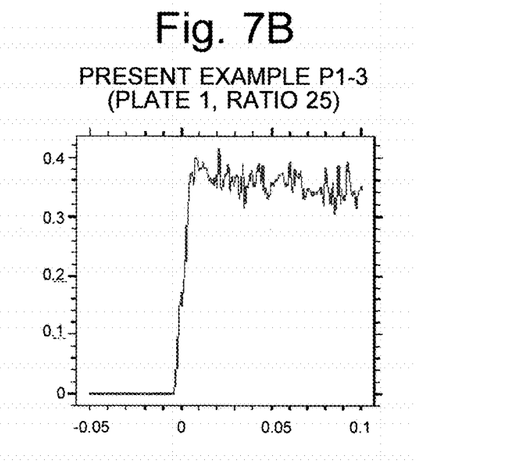
Figure 7C:
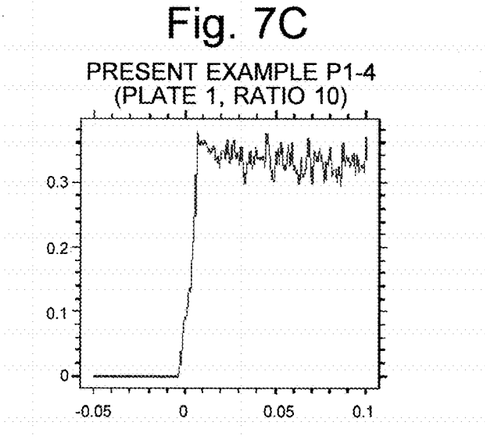
Figure 7D:
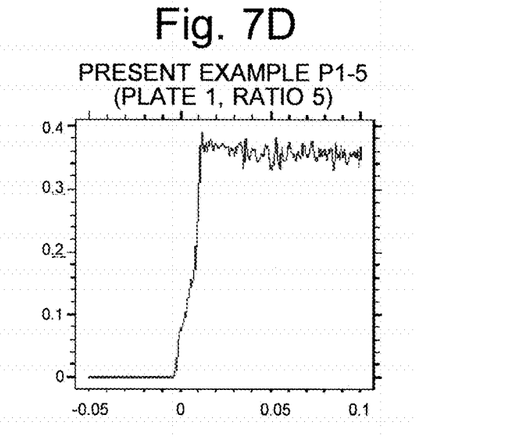
Figure 7E:
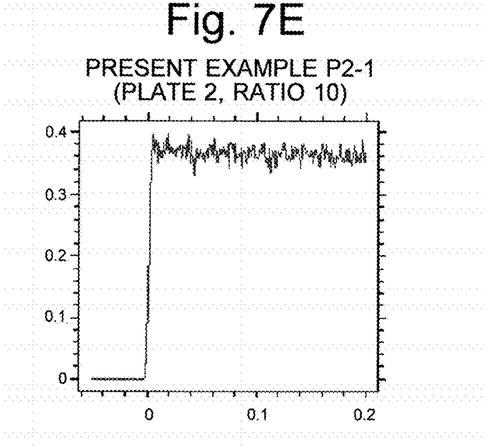
Figure 7F:
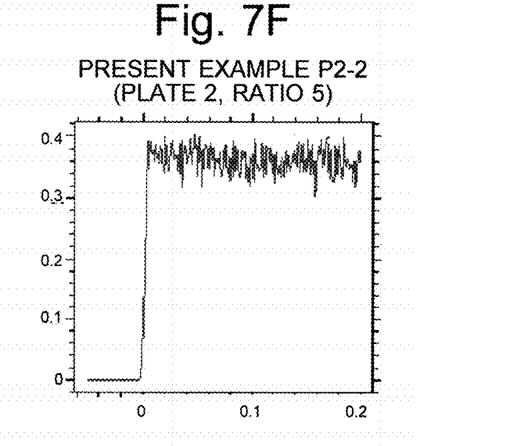

FIG. 6 is a list of the spherical grid electrodes used in the present simulation, while FIGS. 7A-7F are the simulation results. The plate electrode 2 consisted of a dome-shaped metallic body having a thickness of 50 μm, with openings (through-holes) having a diameter of 30 μm formed at intervals of 50 μm (i.e. the grid was four times finer than that of the plate electrode 1, while the interval and diameter of the through-holes as well as the thickness of the electrode were all one half of those of the plate electrode 1). The simulation results shown in FIGS. 7A-7F demonstrate that increasing the potential-gradient ratio produces a steeper rise of the graph and improves the energy-resolving power. Comparing the present examples P1-4 with P2-1 (both of which had a potential-gradient ratio of 10), or present examples P1-5 with P2-2 (a potential-gradient ratio of 5), shows that the energy-resolving power can be improved by providing the plate electrodes with a finer grid.

The results of the two simulations demonstrate that adopting the configuration of the present embodiment can provide a higher level of energy-resolving power than the conventional retarding potential type energy analyzer. Accordingly, for example, it is possible to obtain an energy spectrum of charged particles in a photoelectron spectrometry or similar spectroscopic measurement by detecting the charged particles at each of a plurality of retarding voltages and determining the intensity differences of those particles. Additionally, adopting the configuration of the present embodiment makes it possible to guide the charged particles to the detector without changing their travelling direction (i.e. while maintaining the direction in which those particles have been released from the sample). Therefore, by using a two-dimensional detector including the MCP 31 and fluorescent screen 32 as in the previous embodiment, the angular distribution of the photoelectrons emitted from the sample can also be simultaneously determined. The "two-dimensional detector" in the present context is not limited to a detector having a charged-particle receiving surface, as with the two-dimensional detector including the MCP 31 and fluorescent screen 32; it also includes a two-dimensional detector composed of a plurality of channeltrons (secondary electron multiplier tubes) or similar zero-dimensional detectors arranged in the form of a two-dimensional array.

Conventionally, hemispherical electrostatic analyzers have been used for measurements which require high levels of energy-resolving power and angle-resolving power. In this type of analyzer, among the photoelectrons emitted from a sample, those which are emitted in a predetermined direction are introduced into the inside of the hemispherical analyzer. The hemisphere contains an inner hemisphere and outer hemisphere, between which an electric field corresponding to the voltage difference applied to those hemispheres is formed. Among the photoelectrons introduced into the hemisphere, only the photoelectrons having an amount of energy corresponding to that voltage difference pass through the space between the inner and outer spheres, and are detected.

The previously described hemispherical electrostatic analyzer is normally large and expensive. Furthermore, since only the photoelectrons emitted from the sample at a predetermined angle are detected, obtaining the angular distribution of the photoelectrons emitted from the sample requires driving at least either the sample surface or hemispherical electrostatic analyzer so as to sequentially vary their relative angle, so that a considerable amount of time is needed for the measurement. By comparison, the retarding potential type energy analyzer of the present embodiment has a simple configuration including three grid electrodes, power source and detector, and therefore can be smaller in size and less expensive than the hemispherical electrostatic analyzer. Furthermore, since the angular distribution of the photoelectrons can be determined by a single measurement, it is possible to determine the angular distribution of the photoelectrons emitted from a sample even if, for example, this sample is easily damaged or denatured by the irradiation with light.

Any of the previously described embodiments is a mere example and can be appropriately changed within the spirit of the present invention. The present invention is based on the technical idea that the ratio of the rear-side potential gradient to the front-side potential gradient is made to be greater than the conventional ratio by satisfying at least one of the following two requirements:

(1) the front grid electrode, reference grid electrode and rear grid electrode are arranged so that the distance between the reference grid electrode and the rear grid electrode is shorter than the distance between the reference grid electrode and the front grid electrode; and (2) the potential difference between the reference grid electrode and the rear grid electrode is made to be greater than the potential difference between the reference grid electrode and the front grid electrode.

The idea can be embodied by various arrangements of the electrodes and amounts of the applied voltages other than the previous embodiments.

Figure 8:
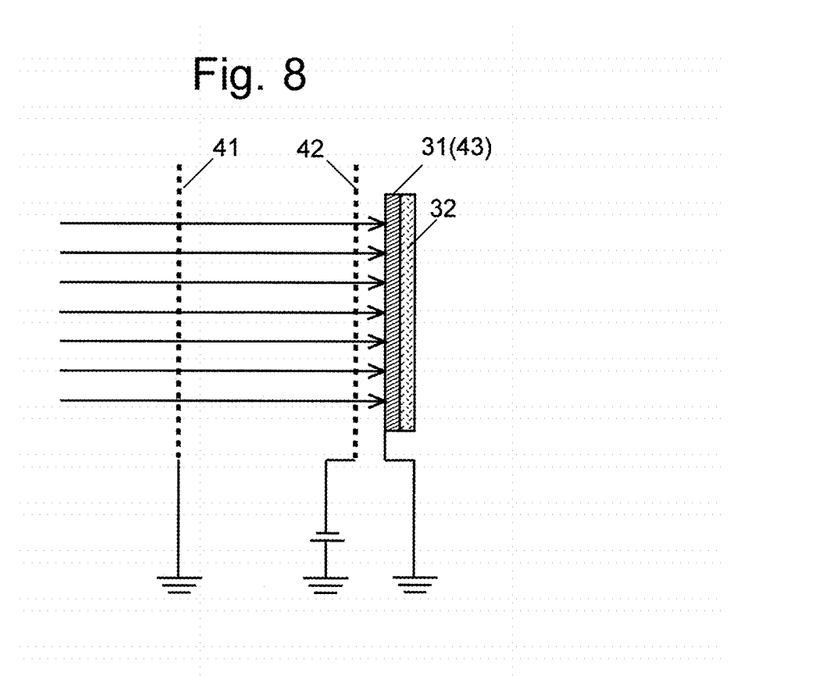
FIG. 8 is a configuration diagram of the main components in another embodiment of the retarding potential type energy analyzer according to the present invention.

The previous embodiments are concerned with the case of performing a measurement for the photoelectrons emitted from a single point on a sample surface. The present invention can also be applied in a measurement of charged particles, such as an ion beam. For example, in the case of a measurement of a substantially parallel beam shaped by an electron lens or similar charged-particle optical system, a system as shown FIG. 8 including two planer grid electrodes (front grid electrode 41 and intermediate grid electrode 42), MCP 31 and fluorescent screen 32 can be suitably used. In FIG. 8, the detection surface of the MCP 31 is grounded so as to use it as the rear grid electrode 43. A configuration using a rear grid electrode 43 apart from the MCP 31 is also possible. For example, in the case of using channeltrons, Faraday cups or similar devices as the detector, the detection surface cannot be used as the rear grid electrode. Therefore, the rear grid electrode 43 should be placed between the intermediate grid electrode 42 and the detector.

As explained in the previous discussion on the simulation results, increasing the ratio of the rear-side potential gradient to the front-side potential gradient improves the energy-resolving power. However, placing the intermediate and rear grid electrodes too close to each other may possibly cause electric discharge between the two electrodes. In such a case, as shown in FIG. 9, a voltage with the opposite polarity to the charged particles (in the case of electrons, a positive voltage) can be applied to the rear grid electrode 43 and the receiving surface of the MCP 31, whereby the potential-gradient ratio can be increased without placing the rear grid electrode 43 too close to the intermediate grid electrode 42.

Figure 9:
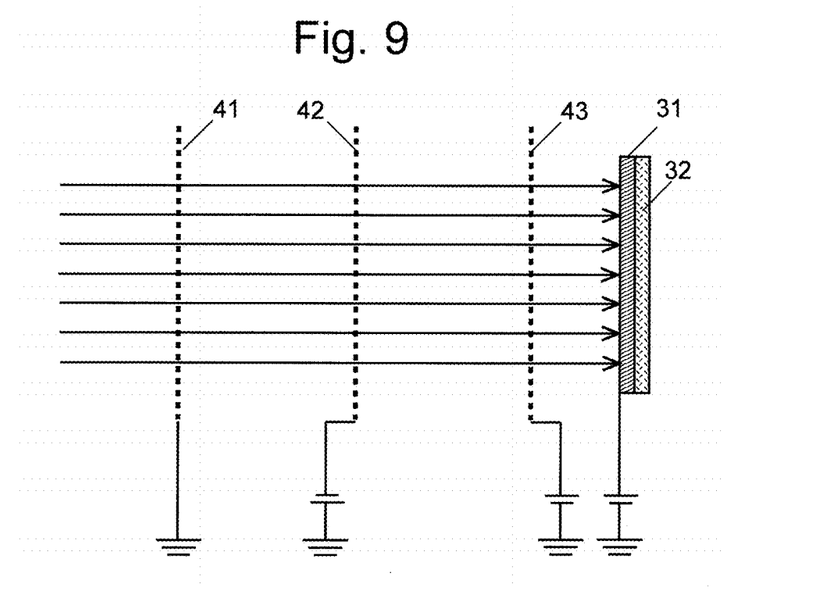
FIG. 9 is a configuration diagram of the main components in still another embodiment of the retarding potential type energy analyzer according to the present invention.

In the configuration of FIG. 9, a voltage having the same polarity as the charged particles may be applied to the front grid electrode 41 so that the rear-side potential gradient becomes steeper than the front-side potential gradient. For example, such a configuration can be suitably applied in the case where an electron optical system for shaping a radiation of charged particles into a substantially parallel beam (e.g. an electron lens or collimator) is placed between the charged-particle source (not shown) and the front grid electrode 41. If a voltage is applied to a component of such an electron optical system or similar device, the front grid electrode located next to that component should preferably be given the same potential as this component. Similarly, if a voltage is applied to a component located on the exit side of the rear grid electrode, the rear grid electrode located next to that component should preferably be given the same potential as this component.

Figure 10A:
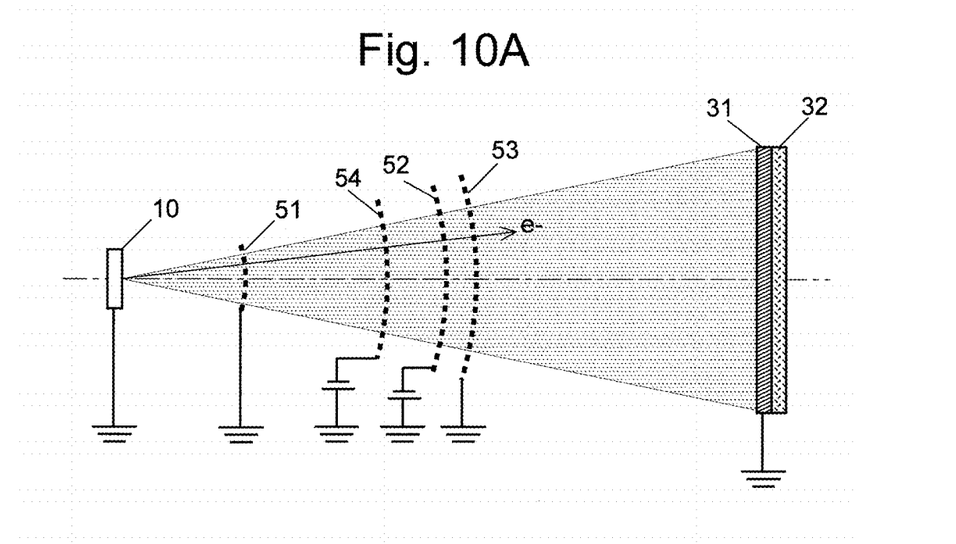
FIGS. 10A-10C are configuration diagrams of the main components in still another embodiment of the retarding potential type energy analyzer according to the present invention.
Figure 10B:
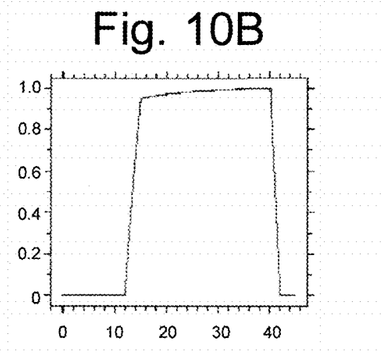
Figure 10C:
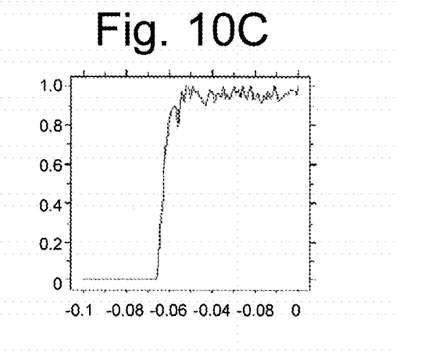

Three grid electrodes are used in any of the previous embodiments. It is also possible to use four or more grid electrodes, as shown in FIG. 10A. In FIG. 10A, an auxiliary grid electrode 54 is placed between the front grid electrode 51 and the intermediate grid electrode 52, and a voltage having the same polarity as the charged particles is applied to the auxiliary grid electrode 54, whereby the potential-gradient ratio is increased without placing the rear grid electrode 53 too close to the intermediate grid electrode 52. As one example, a simulation was performed under the following conditions: the first front grid electrode 51 was placed at a position of 12 mm from the sample 10 and grounded; the second front grid electrode 54 was placed at a position of 15 mm from the sample 10 and supplied with a voltage corresponding to 95% of the retarding voltage; the intermediate grid electrode 52 was placed at a position of 40 mm from the sample 10 and supplied with a voltage corresponding to the retarding voltage; and the rear grid electrode 53 was placed at a position of 42 mm from the sample 10 and grounded (where the grid electrodes were all spherical plate electrodes, with the intermediate grid electrode having a thorough-hole diameter of 0.18 mm, through-hole interval of 0.20 mm and electrode thickness of 0.10 mm). FIG. 10B shows the simulation result of the potential gradient, and FIG. 10C shows the energy-resolving power. The horizontal axis in FIG. 10B represents the distance from the sample surface (in mm), while the vertical axis represents a relative value of the potential with the retarding voltage defined as 1. It was confirmed that this configuration could achieve an energy-resolving power of approximately 10000 and angle-resolving power (in full width at half maximum) of ±0.3 degrees.

REFERENCE SIGNS LIST

10 . . . Sample
21, 41, 51 . . . Front Grid Electrode
22, 42, 52 . . . Intermediate Grid Electrode
23, 43, 53 . . . Rear Grid Electrode
31 . . . MCP
32 . . . Fluorescent Screen
54 . . . Auxiliary Grid Electrode

The invention claimed is:

1. A retarding potential type energy analyzer for measuring an energy of a charged particle emitted from a charged-particle source, using a charged-particle detector, the analyzer comprising:
a) three grid electrodes sequentially arranged as a front grid electrode, a reference grid electrode and a rear grid electrode in said order between the charged-particle source and the charged-particle detector, in such a manner that a distance between the reference grid electrode and the rear grid electrode is shorter than a distance between the reference grid electrode and the front grid electrode, wherein the reference grid is a single electrode; and
b) a voltage applier for applying voltage to at least one of the three grid electrodes so as to give an upward potential difference with a predetermined magnitude between the reference grid electrode and the front grid electrode as well as a downward potential difference with a magnitude equal to or greater than the upward potential difference between the reference grid electrode and the rear grid electrode, wherein
a ratio of an absolute value of a potential gradient formed on a side of the rear grid electrode of the reference grid electrode to an absolute value of a potential gradient formed on a side of the front grid electrode of the reference grid electrode is larger than a ratio obtained in a configuration in which a front grid electrode, the reference grid electrode, and the rear grid electrode are equally spaced.

2. The retarding potential type energy analyzer according to claim 1, wherein a first voltage having a same polarity as the charged particle and a second voltage whose absolute value is greater than the first voltage are respectively applied to the front grid electrode and the reference grid electrode.

3. The retarding potential type energy analyzer according to claim 1, wherein a voltage having a same polarity as the charged particle is applied to the reference grid electrode, and a voltage having an opposite polarity to the charged particle is applied to the rear grid electrode.

4. The retarding potential type energy analyzer according to claim 1, wherein the charged-particle detector is a two-dimensional detector.

5. The retarding potential type energy analyzer according to claim 1, wherein the three grid electrodes are spherical grid electrodes.

6. The retarding potential type energy analyzer according to claim 1, wherein the analyzer consists of the three grid electrodes and the voltage applier.

7. The retarding potential type energy analyzer according to claim 1, wherein
the distance between the reference grid electrode and the front grid electrode is equal to or more than 1.44 times the distance between the reference grid electrode and the rear grid electrode.

8. The retarding potential type energy analyzer according to claim 1, wherein
the ratio of the absolute value of the potential gradient formed on the side of the rear grid electrode of the reference grid electrode to the absolute value of the potential gradient formed on the side of the front grid electrode of the reference grid electrode is equal to or more than 5.0.

9. A retarding potential type energy analyzer for measuring an energy of a charged particle emitted from a charged-particle source, using a charged-particle detector, the analyzer comprising:
a) three grid electrodes sequentially arranged as a front grid electrode, a reference grid electrode and a rear grid electrode in said order between the charged-particle source and the charged-particle detector, in such a manner that a distance between the reference grid electrode and the front grid electrode is equal to or longer than a distance between the reference grid electrode and the rear grid electrode; and
b) a voltage applier for applying a voltage to at least one of the three grid electrodes so as to give an upward potential difference with a predetermined magnitude between the reference grid electrode and the front grid electrode as well as a downward potential difference with a magnitude greater than the upward potential difference between the reference grid electrode and the rear grid electrode.

10. The retarding potential type energy analyzer according to claim 9, wherein a first voltage having a same polarity as the charged particle and a second voltage whose absolute value is greater than the first voltage are respectively applied to the front grid electrode and the reference grid electrode.

11. The retarding potential type energy analyzer according to claim 9, wherein a voltage having a same polarity as the charged particle is applied to the reference grid electrode, and a voltage having an opposite polarity to the charged particle is applied to the rear grid electrode.

12. The retarding potential type energy analyzer according to claim 9, wherein the charged-particle detector is a two-dimensional detector.

13. The retarding potential type energy analyzer according to claim 9, wherein the three grid electrodes are spherical grid electrodes.

* * * * *